(12) United States Patent
Tsai et al.

(10) Patent No.: US 8,722,501 B2
(45) Date of Patent: May 13, 2014

(54) METHOD FOR MANUFACTURING MULTI-GATE TRANSISTOR DEVICE

(75) Inventors: Shih-Hung Tsai, Tainan (TW); Chien-Liang Lin, Taoyuan County (TW); Chien-Ting Lin, Hsinchu (TW); Ssu-I Fu, Kaohsiung (TW); Ying-Tsung Chen, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 156 days.

(21) Appl. No.: 13/275,337

(22) Filed: Oct. 18, 2011

(65) Prior Publication Data

US 2013/0095616 A1  Apr. 18, 2013

(51) Int. Cl.
*H01L 21/336* (2006.01)

(52) U.S. Cl.
USPC ........... 438/300; 438/197; 438/696; 438/763; 257/E21.409

(58) Field of Classification Search
USPC .......... 257/E21.409; 438/197, 300, 696, 703, 438/763
See application file for complete search history.

(56) References Cited

U.S. PATENT DOCUMENTS

| | | | |
|---|---|---|---|
| 5,783,475 A * | 7/1998 | Ramaswami | ................. 438/303 |
| 6,043,138 A | 3/2000 | Ibok | |
| 6,492,216 B1 | 12/2002 | Yeo | |
| 6,855,607 B2 | 2/2005 | Achuthan | |
| 6,921,963 B2 | 7/2005 | Krivokapic | |
| 7,013,446 B2 | 3/2006 | Ohba | |
| 7,087,477 B2 | 8/2006 | Fried | |
| 7,091,551 B1 | 8/2006 | Anderson | |
| 7,112,495 B2 | 9/2006 | Ko | |
| 7,112,497 B2 * | 9/2006 | Mehrad et al. | ................ 438/303 |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,384,838 B2 | 6/2008 | Hsu et al. | |
| 7,470,570 B2 | 12/2008 | Beintner | |
| 7,476,578 B1 | 1/2009 | Cheng et al. | |
| 7,521,324 B2 | 4/2009 | Ohmi | |
| 7,531,437 B2 | 5/2009 | Brask | |
| 7,569,857 B2 | 8/2009 | Simon | |
| 7,592,270 B2 | 9/2009 | Teo | |
| 7,704,835 B2 | 4/2010 | Singh et al. | |
| 2004/0195624 A1 | 10/2004 | Liu | |
| 2005/0051825 A1 | 3/2005 | Fujiwara | |
| 2005/0130434 A1 * | 6/2005 | Chien et al. | ................... 438/706 |
| 2006/0099830 A1 | 5/2006 | Walther | |
| 2006/0286729 A1 | 12/2006 | Kavalieros | |
| 2007/0015365 A1 | 1/2007 | Chen | |
| 2007/0072376 A1 | 3/2007 | Chen | |
| 2007/0108528 A1 | 5/2007 | Anderson | |

(Continued)

*Primary Examiner* — Robert Huber
(74) *Attorney, Agent, or Firm* — Winston Hsu; Scott Margo

(57) ABSTRACT

A method for manufacturing multi-gate transistor device includes providing a semiconductor substrate having a patterned semiconductor layer, a gate dielectric layer and a gate layer sequentially formed thereon, forming a multiple insulating layer sequentially having a first insulating layer and a second insulating layer and covering the patterned semiconductor layer and the gate layer, removing a portion of the multiple insulating layer to simultaneously form a first spacer around the gate layer and a second spacer around the patterned semiconductor layer, removing the second spacer to expose a portion of the first insulating layer covering the patterned semiconductor layer and simultaneously removing a portion of the first spacer to form a third spacer around the gate layer, and removing the exposed first insulating layer to expose the patterned semiconductor layer.

12 Claims, 6 Drawing Sheets

(56) References Cited

U.S. PATENT DOCUMENTS

| | | |
|---|---|---|
| 2007/0158756 A1 | 7/2007 | Dreeskornfeld |
| 2007/0218661 A1 | 9/2007 | Shroff |
| 2008/0061366 A1 | 3/2008 | Liu |
| 2008/0157208 A1 | 7/2008 | Fischer |
| 2009/0057759 A1 | 3/2009 | Obradovic |
| 2009/0124097 A1 | 5/2009 | Cheng |
| 2009/0200494 A1 | 8/2009 | Hatem |
| 2009/0206406 A1 | 8/2009 | Rachmady |
| 2009/0242964 A1 | 10/2009 | Akil |
| 2009/0269916 A1 | 10/2009 | Kang |
| 2010/0044783 A1 | 2/2010 | Chuang |
| 2010/0048027 A1 | 2/2010 | Cheng |
| 2010/0072553 A1 | 3/2010 | Xu |
| 2010/0129994 A1 | 5/2010 | Awad |
| 2010/0144121 A1 | 6/2010 | Chang |
| 2010/0167506 A1 | 7/2010 | Lin |

* cited by examiner

METHOD FOR MANUFACTURING MULTI-GATE TRANSISTOR DEVICE

BACKGROUND OF THE INVENTION

1. Field of the Invention

The invention relates to a method for manufacturing a multi-gate transistor device.

2. Description of the Prior Art

Conventional planar metal-oxide-semiconductor (MOS) transistor has difficulty when scaling to 65 nm and below. Therefore the non-planar transistor technology such as Fin Field effect transistor (FinFET) technology that allows smaller size and higher performance is developed to replace the planar MOS transistor.

Please refer to FIG. 1, which is a schematic drawing of a conventional FinFET device. As shown in FIG. 1, the conventional FinFET device 100 is formed by: first a single crystalline silicon layer of a silicon-on-insulator (SOI) substrate 102 is patterned to form a fin film (not shown) in the SOI substrate 102 by proper etching process. Then, an insulating layer 104 covering the fin film is formed and followed by forming a gate 106 covering the insulating layer 104 and the fin film. Next, ion implantation and anneal treatment are performed to form a source/drain 108 in the fin film not covered by the gate 106. Since the manufacturing processes of the FinFET device 100 are easily integrated into the traditional logic device processes, it provides superior compatibility. Furthermore, when the FinFET device 100 is formed on the SOI substrate 102, traditional shallow trench isolation (STI) is no longer required. More important, since the FinFET device increases the overlapping area between the gate and the substrate, the channel region is more effectively controlled. This therefore reduces drain-induced barrier lowering (DIBL) effect and short channel effect. In addition, the channel region is longer under the same gate length, and thus the current between the source and the drain is increased.

However, because the source/drain 108 is a slim structure, it always suffers larger resistance and renders adverse impact to the electrical performance of the FinFET device 100. Furthermore, it is found since the source/drain 108 is a slim structure, alignment between the source/drain 108 and the contact plug in the following contact process becomes complicated and difficult. And thus process window of the contact process is adversely influenced.

SUMMARY OF THE INVENTION

According to an aspect of the present invention, a method for manufacturing a multi-gate transistor device is provided. The method includes providing a semiconductor substrate having a patterned semiconductor layer, a gate dielectric layer and a gate layer formed thereon, the gate layer covering a portion of the patterned semiconductor layer; forming a multiple insulating layer on the semiconductor substrate, the multiple insulating layer covering the patterned semiconductor layer and the gate layer, wherein the multiple insulating layer sequentially has a first insulating layer and a second insulating layer; performing a first etching process to remove a portion of the multiple insulating layer to simultaneously form a first spacer around the gate layer and a second spacer around the patterned semiconductor layer; removing the second spacer to expose a portion of the first insulating layer and simultaneously removing a portion of the first spacer to form a third spacer around the gate layer, the first insulating layer still covering the patterned semiconductor layer; and removing the exposed first insulating layer to expose the patterned semiconductor layer.

According to the method for manufacturing a multi-gate transistor device, the multiple insulating layer serves as a protecting layer for its underneath patterned semiconductor layer during removing the second spacer that covers the patterned semiconductor layer. Therefore the profile of the patterned semiconductor layer is protected from any damage when exposing the patterned semiconductor layer. Consequently, areas for growing the epitaxial layers, which is formed by performing the selective epitaxial growth (SEG) method, are increased and eventually resistance of the source/drain of the FinFET is reduced. Simultaneously, since more epitaxial layers are formed on the patterned semiconductor layer, surface area of the source/drain are increased and thus process window of the contact process is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-7 are schematic drawings illustrating a method for manufacturing a multi-gate transistor device provided by a first preferred embodiment of the present invention, wherein FIG. 2 is a cross-sectional view taken along line A-A' of FIG. 7, FIG. 3 is cross-sectional view in a step subsequent to FIG. 2, FIG. 4 is cross-sectional view in a step subsequent to FIG. 3, FIG. 5 is cross-sectional view in a step subsequent to FIG. 4, FIG. 6 is cross-sectional view in a step subsequent to FIG. 5, and FIG. 7 is cross-sectional view in a step subsequent to FIG. 6.

FIGS. 8-12 are schematic drawings illustrating a method for manufacturing a multi-gate transistor device provided by a second preferred embodiment of the present invention, wherein FIG. 9 is a cross-sectional view in a step subsequent to FIG. 8, FIG. 10 is cross-sectional view in a step subsequent to FIG. 9, FIG. 11 is cross-sectional view in a step subsequent to FIG. 10, and FIG. 12 is cross-sectional view in a step subsequent to FIG. 11.

DETAILED DESCRIPTION

Figure 1:
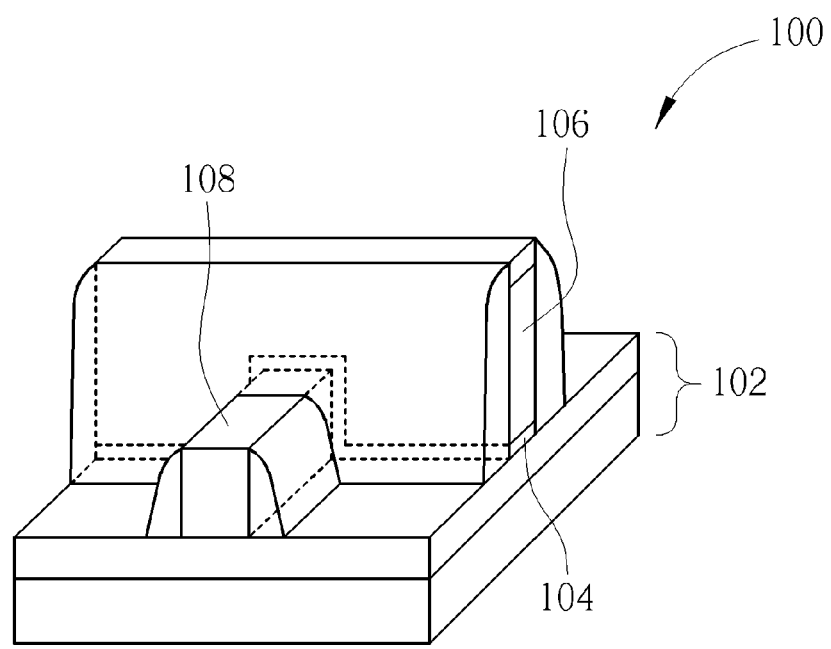
FIG. 1 is a schematic drawing of a conventional FinFET device.
Figure 2:
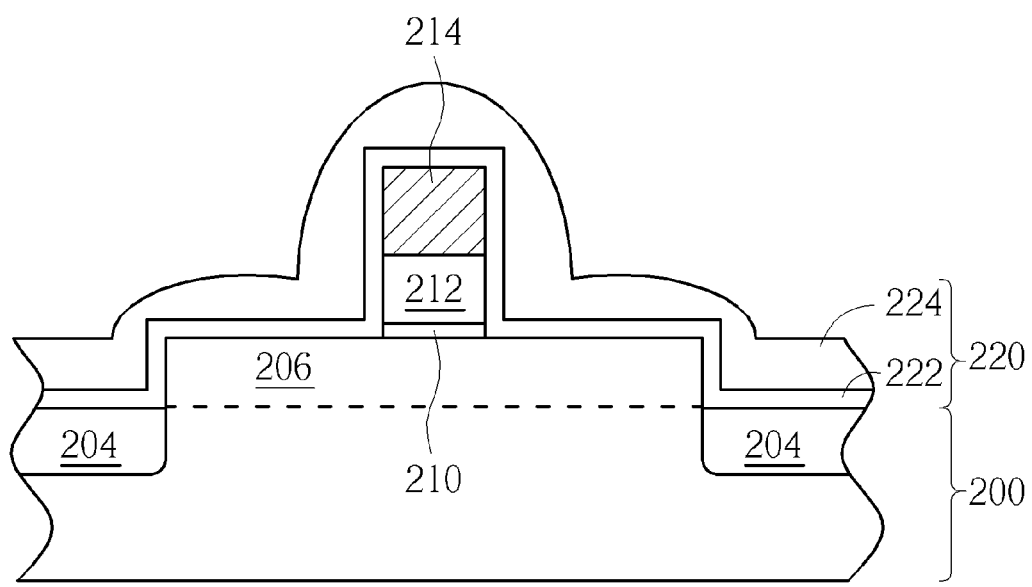
Figure 5:
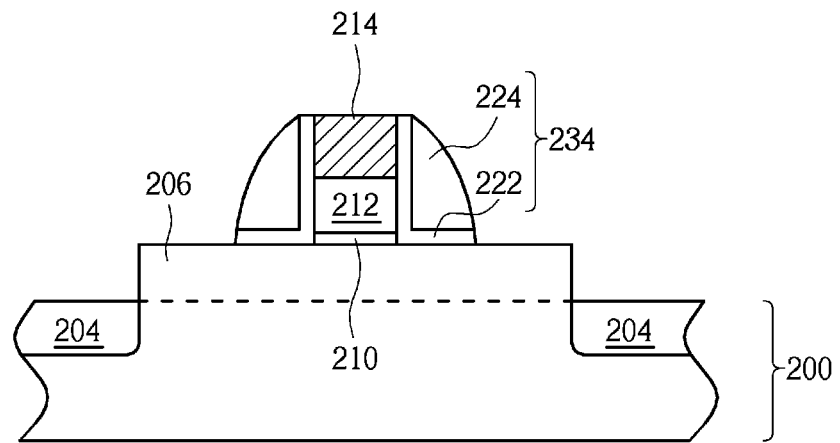
Figure 6:
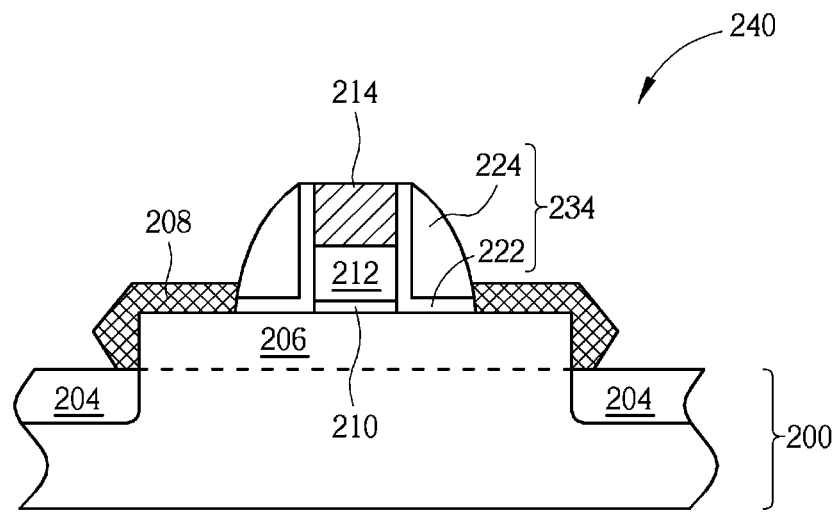
Figure 7:
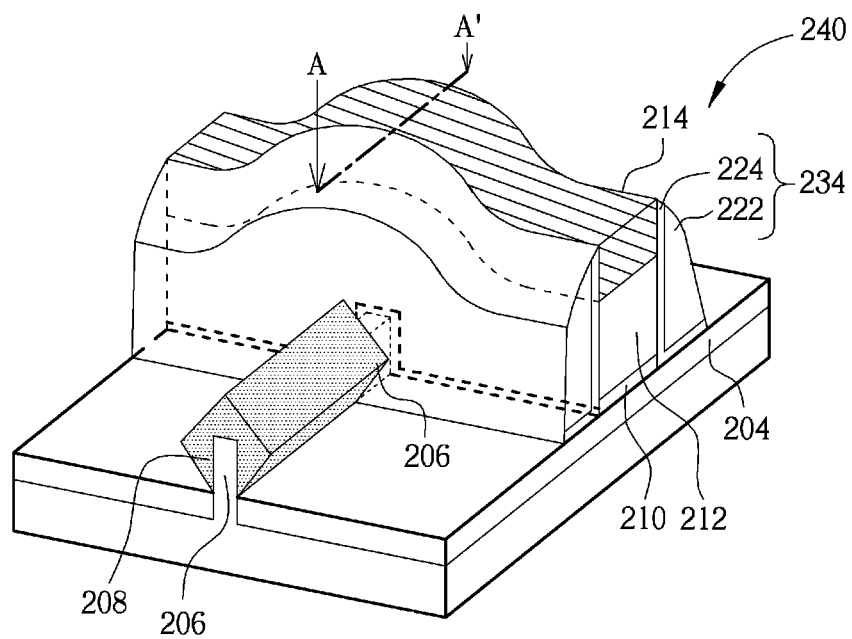

Please refer to FIGS. 2-7, which are schematic drawings illustrating a method for manufacturing a multi-gate transistor device provided by a first preferred embodiment of the present invention, wherein FIGS. 2-6 are cross-sectional views taken along line A-A' of FIG. 7. As shown in FIG. 2, the preferred embodiment first provides a semiconductor substrate 200. The semiconductor substrate 200 can include a bulk silicon substrate having a plurality of shallow trench isolations (STIs) 204 formed therein. However, the semiconductor substrate 200 can be a SOI substrate.

Please refer to FIG. 2 again. Next, a patterned hard mask (not shown) for defining at least a fin of a multi-gate transistor device is formed on the semiconductor substrate 200 and followed by performing an etching process. Thus a portion of the semiconductor material of the semiconductor substrate 200 is removed to form at least a patterned semiconductor layer 206 on the semiconductor substrate 200. The patterned semiconductor layer 206 includes at least a fin for a multi-gate transistor device as shown in FIG. 2. The fin 206 includes a width and a height and a ratio between the width and the height is about 1:1.5-1:2. For example, the width of the fin is about 20 nanometer (nm) and the height of the fin is about 30 nm, but not limited to this.

Please still refer to FIG. 2. Then, a dielectric layer (not shown), a gate forming layer (not shown) and a patterned hard mask 214 are sequentially formed on the semiconductor substrate 200 and followed by patterning the dielectric layer and the gate forming layer through the patterned hard mask 214. Accordingly, a gate dielectric layer 210 and a gate layer 212 covering a portion of the patterned semiconductor layer 206 are formed on the semiconductor substrate 200. A height sum of patterned hard mask 214, the gate layer 212 and the gate dielectric layer 210 is about 60 nm, but not limited to this. Furthermore, an extension direction of the gate dielectric layer 210 and the gate layer 212 is perpendicular to an extension direction of the fin 206 as shown in FIG. 7. And the gate dielectric layer 210 and the gate layer 212 cover a portion of a sidewall of the patterned semiconductor layer 206. The gate dielectric layer 210 includes the conventional dielectric material such as silicon oxide (SiO), silicon nitride (SiN), or silicon oxynitride (SiON). In the preferred embodiment, the gate dielectric layer 210 can further include high-K dielectric material such as hafnium oxide (HfO), hafnium silicate (HfSiO), or metal oxide or metal silicate exemplarily of aluminum (Al), zirconium (Zr), lanthanum (La), but not limited to this. In addition, when the gate dielectric layer 210 of the preferred embodiment adopts the high-K dielectric material, the present invention can be further integrated to the metal gate process. Therefore control gate compatible to the high-K gate dielectric layer is obtained. Accordingly, the gate layer 212 can include different materials according to the gate-first or gate-last process. Moreover, the patterned hard mask 214 can include silicon nitride, but not limited to this.

In addition, after forming the gate dielectric layer 210 and the gate layer 212, a tilted implantation as required is performed to form a source/drain extension regions (not shown) in the patterned semiconductor layer 206.

As shown in FIG. 2, after forming the source/drain extension regions, a multiple insulating layer 220 is formed on the semiconductor substrate 200 in accordance with the preferred embodiment. The multiple insulating layer 220 covers the patterned semiconductor layer 206, the patterned hard mask 214, and the gate layer 212. In the preferred embodiment, the multiple insulating layer 220 is a bi-layered structure and sequentially includes a first insulating layer 222 and a second insulating layer 224 from bottom to top as shown FIG. 2. An etching rate of the first insulating layer 222 is different from an etching rate of the second insulating layer 224. For example, the first insulating layer 222 includes a silicon nitride layer while the second insulating layer 224 includes a silicon oxide layer. Furthermore, the first insulating layer 222 is a conformal layer preferably formed by an atomic layer deposition (ALD) method in accordance with the preferred embodiment. A thickness of the first insulating layer 222 is about 50 nm-100 nm. The second insulating layer 224 is a silicon oxide layer preferably formed by a chemical vapor deposition (CVD) method and a thickness of the second insulating layer 224 is about 200 nm-300 nm.

Figure 3:
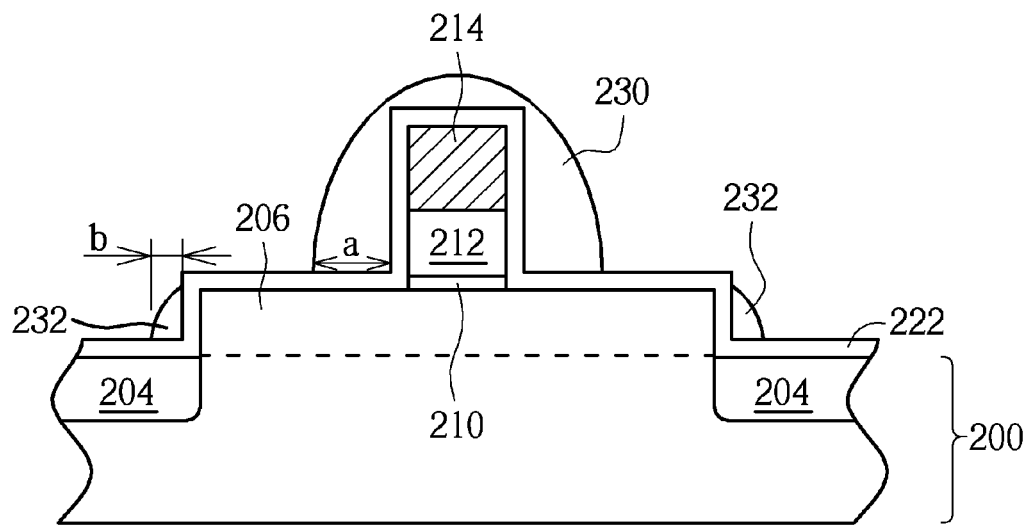

Please refer to FIG. 3. Next, a portion of the multiple insulating layer 220 is removed. Particularly speaking, an anisotropic etching process such as a dry etching method is performed to remove the second insulating layer 224 to form a the first spacer 230 around the patterned hard mask 214 and the gate layer 212 and simultaneously to form a second spacer 232 around the patterned semiconductor layer 206. It is noteworthy that because the height sum of the patterned hard mask 214 and the gate layer 212 is as twice as the height of the patterned semiconductor layer 206, the second spacer 232 around the patterned semiconductor layer 206 is spontaneously formed smaller than the first spacer 230 due to the characteristic of the dry etching method. As shown in FIG. 3, a width "a" of the first spacer 230 is always larger than a width "b" of the second spacer 232. Furthermore, during forming the first spacer 230 and the second spacer 232, a portion of the multiple insulating layer 220, specifically a portion of the first insulating layer 222, is exposed.

Figure 4:
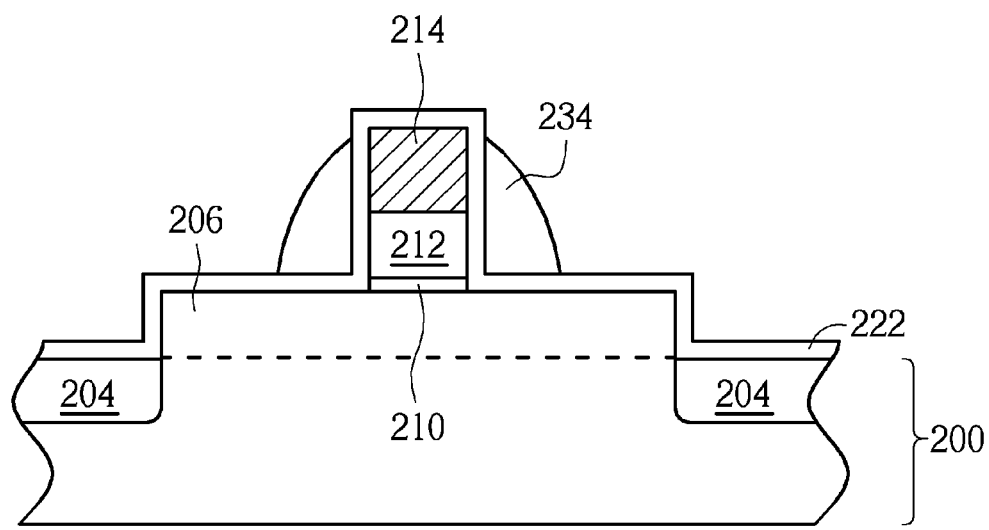

Please refer to FIG. 4. Next, an isotropic process such as a wet etching method is performed to remove the second spacer 232 to exposed the first insulating layer 222 of the multiple insulating layer 220 by, for example but not limited to, a dilute hydrogen fluoride (DHF). In addition, a portion of the first spacer 230 is removed to form a third spacer 234 around the patterned hard mask 214 and the gate layer 212 by the wet etching process. The third spacer 234 is smaller than the first spacer 230. It is noteworthy that during removing the second spacer 232 by the wet etching process, the first insulating layer 222 still covers the patterned semiconductor layer 206, the patterned hard mask 214 and the gate layer 212 and renders protection to the patterned semiconductor layer 206 and the gate layer 212. Consequently, the patterned semiconductor layer 206 and the gate layer 212 are impervious to the wet etching process due to the first insulating layer 222.

Please refer to FIG. 5. Another isotropic process such as a wet etching process is performed to remove the first insulating layer 222 and to expose the patterned semiconductor layer 206 by, for example but not limited to, a hot phosphoric acid. Consequently, the third spacer 234 is obtained to include both the first insulating layer 222 and the second insulating layer 224. It is noteworthy that because the different etching rates between the first insulating layer 222 and the second insulating layer 224, the profile of the third spacer 234 is not influenced during removing the first insulating layer 222. Furthermore, since the first insulating layer 222 is a thin conformal layer, the first insulating layer 222 can be easily removed without damaging the patterned semiconductor layer 206. It is also noteworthy that when the first insulating layer 222 and the patterned hard mask 214 include the same material (for example: silicon nitride), a portion of the patterned hard mask 214 is removed during this wet etching process, and thus a height sum of the patterned hard mask 214 and the gate layer 212 is reduced.

Please refer to FIG. 6. After removing the first insulating layer 222 and exposing the patterned semiconductor layer 206, a selective epitaxial growth (SEG) process is performed to form an epitaxial layer 208 on the exposed semiconductor layer 206. Furthermore, materials having lattice constant different from the patterned semiconductor layer 206 is introduced in the SEG process according to the requirement to conductivity types of the multi-gate transistor device. And dopants of a conductivity type can also be introduced before, after or simultaneously in the SEG process. Consequently, source/drain for a multi-gate transistor device and a multi-gate transistor device 240 are simultaneously obtained.

According to the method for manufacturing a multi-gate transistor device provided by the preferred embodiment, the first insulating layer 222 serves as a protecting layer and renders protection to the profile of the patterned semiconductor layer 206 due to the etching rate different from the second insulating layer 224 when forming the spacer. Furthermore, the first insulating layer 222 can be easily removed to expose the surface of top and sidewalls of the patterned semiconductor layer 206 without influencing the profile of the patterned semiconductor layer 206. It other words, the preferred embodiment increases the exposed area of the patterned semiconductor layer 206. It is well-known that the epitaxial layer 208 grows only on the silicon material in the SEG process, therefore the preferred embodiment is able to increase the areas for forming the epitaxial layer 208 by increasing the exposed area of the patterned semiconductor layer 206. Consequently, top and bottom of the patterned semiconductor layer 206 are enlarged because the growth of the epitaxial layer 208 and thus resistance of the source/drain of the multi-gate transistor device 240 is reduced. In the same time, because the surface of the patterned semiconductor layer 206 is increased by forming the epitaxial layer 208, process window of the contact process is improved.

Figure 8:
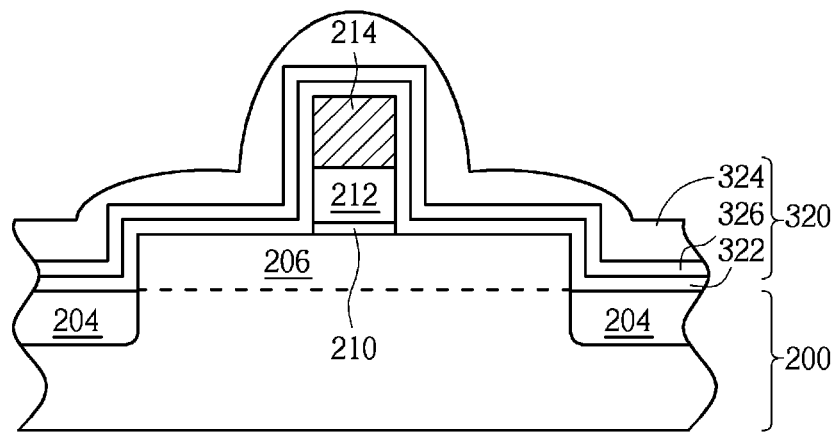

Please refer to FIGS. 8-12, which are schematic drawings illustrating a method for manufacturing a multi-gate transistor device provided by a second preferred embodiment of the present invention. Please note that elements the same in both first and second preferred embodiments are designated by the same numerals, thus the material choices and steps for forming those elements are all omitted in the interest of brevity. As shown in FIG. 8, the preferred embodiment first provides a semiconductor substrate 200 such as a bulk silicon substrate having a plurality of STIs 204 formed therein.

Please refer to FIG. 8 again. Next, a patterned hard mask (not shown) is formed on the semiconductor substrate 200 and followed by performing an etching process. Accordingly, a portion of semiconductor material of the semiconductor substrate 200 is removed to form at least a patterned semiconductor layer 206 on the semiconductor substrate 200. The patterned semiconductor layer 206 includes at least a fin for a multi-gate transistor device as shown in FIG. 8. The fin 206 includes a width and a height and a ratio between the width and the height is about 1:1.5-1:2.

Please still refer to FIG. 8. Subsequently, steps as described above are performed to form a gate dielectric layer 210 and a gate layer 212 covering a portion of the patterned semiconductor layer 206 on the semiconductor substrate 200. Furthermore, an extension direction of the gate dielectric layer 210 and the gate layer 212 is perpendicular to an extension direction of the fin 206 as shown in FIG. 7, and the gate dielectric layer 210 and the gate layer 212 cover a portion of sidewalls of the patterned semiconductor layer 206. After forming the gate dielectric layer 210 and the gate layer 212, a source/drain extension region (not shown) is formed in the patterned semiconductor layer 206 according to the preferred embodiment.

As shown in FIG. 8, after forming after forming the source/drain extension regions, a multiple insulating layer 320 is formed on the semiconductor substrate 200 in accordance with the preferred embodiment. The multiple insulating layer 320 covers the patterned semiconductor layer 206, the patterned hard mask 214, and the gate layer 212. Different from the first preferred embodiment, the multiple insulating layer 320 in the second preferred embodiment is a tri-layered structure and includes a first insulating layer 322, a second insulating layer 324 and a third insulating layer 326 sandwiched between the first insulating layer 322 and the second insulating layer 324 as shown FIG. 8. Etching rates of the first insulating layer 322 and the second insulating layer 324 are different from an etching rate of the third insulating layer 326, and the etching rate of the first insulating layer 322 is preferably different from the etching rate of the second insulating layer 324. For example, the first insulating layer 322 includes a silicon nitride layer, the third insulating layer 326 includes a silicon oxide layer, and the second insulating layer 324 includes a silicon nitride layer, preferably a carbon-doped silicon nitride layer. Furthermore, the first insulating layer 322 and the third insulating layer 326 preferably are conformal layers formed by ALD method in accordance with the preferred embodiment. A thickness sum of the first insulating layer 322 and the third insulating layer 326 is smaller than 100 nm. The second insulating layer 324 is a silicon nitride layer preferably formed by a CVD method and a thickness of the second insulating layer 324 is about 200 nm-300 nm. Though the multiple insulating layer 320 is an nitride-oxide-nitride (NON) structure in the preferred embodiment, the multiple insulating layer 320 still can be an oxide-nitride-oxide (ONO) structure.

Figure 9:
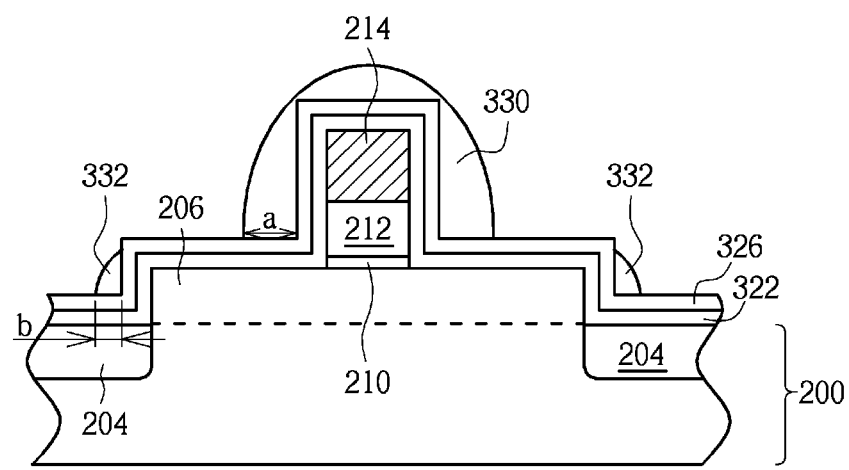

Please refer to FIG. 9. Removing a portion of the multiple insulating layer 320 by an anisotropic process such as a dry etching method. Consequently, a first spacer 330 around the patterned hard mask 214 and the gate layer 212 and a second spacer 332 around the patterned semiconductor layer 206 are simultaneously formed. As mentioned above, because the height sum of the patterned hard mask 214 and the gate layer 212 is as twice as the height of the patterned semiconductor layer 206, the second spacer 332 around the patterned semiconductor layer 206 is spontaneously formed smaller than the first spacer 330 due to the characteristic of the dry etching method. As shown in FIG. 9, a width a of the first spacer 330 is always larger than a width b of the second spacer 332. Furthermore, during forming the first spacer 330 and the second spacer 332, a portion of the multiple insulating layer 320, specifically a portion of the third insulating layer 326, is exposed.

Figure 10:
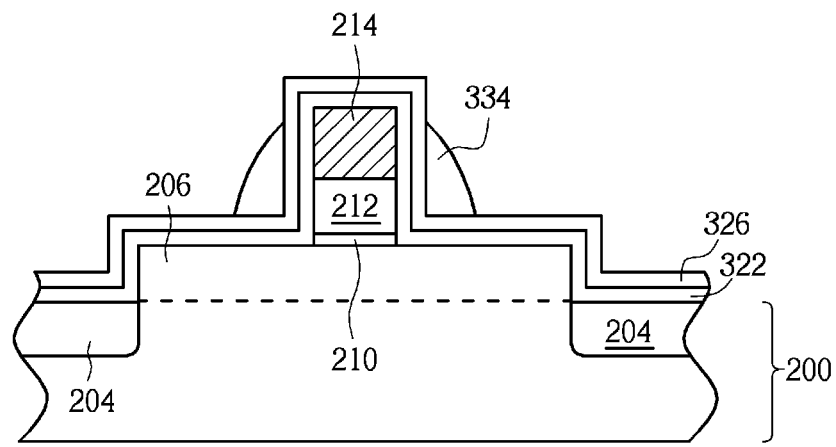

Please refer to FIG. 10. Next, an isotropic process such as a wet etching method is performed to remove the second spacer 332 to expose the third insulating layer 326 of the multiple insulating layer 320. In addition, a portion of the first spacer 330 is removed to form a third spacer 334 around the patterned hard mask 214 and the gate layer 212 by the wet etching process. The third spacer 334 is smaller than the first spacer 330. It is noteworthy that during removing the second spacer 332 by the wet etching process, the third insulating layer 326 and the first insulating layer 322 still cover the patterned semiconductor layer 206, the patterned hard mask 214 and the gate layer 212 and render protection to the underneath patterned semiconductor layer 206 and the gate layer 212. Consequently, the patterned semiconductor layer 206 and the gate layer 212 are impervious to the wet etching process due to the first insulating layer 322 and the third insulating layer 326.

Figure 11:
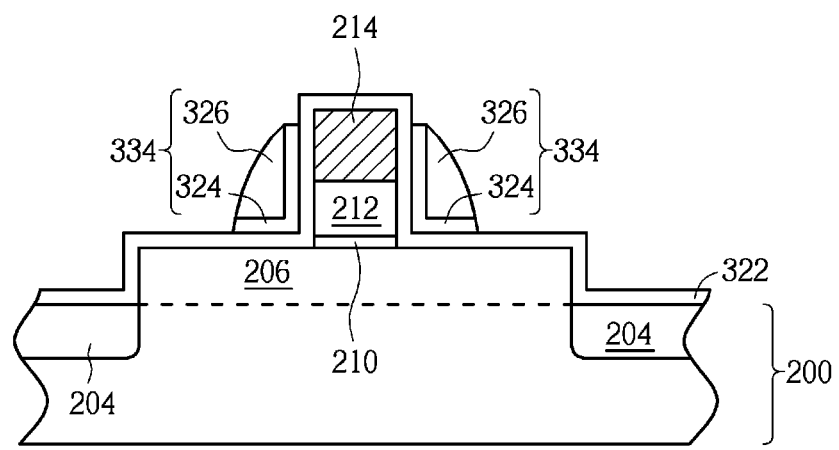

Please refer to FIG. 11. Subsequently, another isotropic process such as a wet etching method is performed to remove the exposed third insulating layer 326 of the multiple insulating layer 320. Thus the first insulating layer 322 is exposed while it still covers the portion of the patterned semiconductor layer 206 and the portion of the patterned hard mask 214. Due to the different etching rates, profiles of the third spacer 334 are impervious in the wet etching process by which the second insulating layer 324 is removed.

Figure 12:
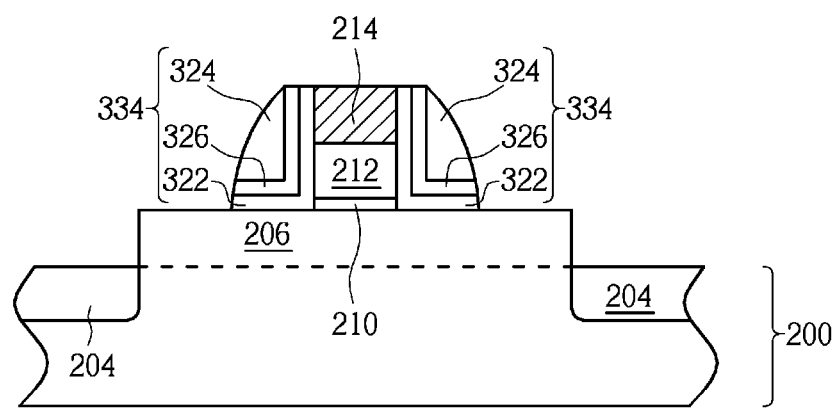

Please refer to FIG. 12. Still another isotropic process such as a wet etching process is performed to remove the first insulating layer 322 and to expose the patterned semiconductor layer 206. Consequently, the third spacer 334 is obtained to include the first insulating layer 322, the third insulating layer 326 and the second insulating layer 324. It is noteworthy that because the first insulating layer 222 is a thin conformal layer and the etching rate of the first insulating layer 322 can be different from that of the third insulating layer 326, the first insulating layer 322 can be easily removed with minor influence to the third spacer 334 and the patterned semiconductor layer 206. It is also noteworthy that when the first insulating layer 322 and the patterned hard mask 214 include the same material (for example: silicon nitride), a portion of the patterned hard mask 214 is removed during this wet etching process, and thus a height sum of the patterned hard mask 214 and the gate layer 212 is reduced.

After removing the first insulating layer 322 and exposing the patterned semiconductor layer 206, a SEG process is performed to form an epitaxial layer 208 (shown in FIG. 7) on the exposed semiconductor layer 206 as mentioned in the first preferred embodiment. Furthermore, materials having lattice constant different from the semiconductor layer 206 is introduced in the SEG process according to the requirement to conductivity types of the multi-gate transistor device. And dopants of a conductivity type can also be introduced before, after or simultaneously in the SEG process. Consequently, source/drain for a multi-gate transistor device and a multi-gate transistor device 240 are simultaneously obtained.

According to the method for manufacturing a multi-gate transistor device provided by the preferred embodiment, the first insulating layer 322 and the third insulating layer 326 serve as a protecting layer and render protection to the profile of the patterned semiconductor layer 206 due to the etching rates different from the second insulating layer 324 when forming the spacer. Furthermore, it is found that undercut etching occurs at the multiple insulating layer when removing the multiple insulating layer if the thickness of the protecting layer is smaller. The undercut etching even causes damage to the gate layer 212. Therefore, the preferred embodiment provides the multilayered insulating layer 320 particularly having the first insulating layer 322 and the third insulating layer 326 with different etching rates for preventing the abovementioned undercut etching. The first insulating layer 322 can be easily removed to expose the surface of top and sidewalls of the patterned semiconductor layer 206 without influencing the profile of the patterned semiconductor layer 206. It other words, the preferred embodiment increases the exposed area of the patterned semiconductor layer 206. Accordingly areas for forming the epitaxial layer 208 are increased and thus the source/drain is enlarged because the growth of the epitaxial layer 208, and thus resistance of the source/drain of the multi-gate transistor device 240 is reduced. In the same time, because the surface of the patterned semiconductor layer 206 is increased by forming the epitaxial layer 208, process window of the contact process is improved.

Additionally, though the method for manufacturing a multi-gate transistor device provided by the present invention is to form a tri-gate transistor device as shown in FIG. 7, the method also is not limited to this. In other words, the method for manufacturing a multi-gate transistor device can be provided to form a double-gate transistor device.

According to the method for manufacturing a multi-gate transistor device, the multiple insulating layer serves as a protecting layer for its underneath patterned semiconductor layer during removing the spacer that covers the patterned semiconductor layer. Therefore the profile of the patterned semiconductor layer is protected from any damage. That means the patterned semiconductor layer of the multi-gate transistor device can be exposed on the semiconductor substrate without any damage. Consequently, areas for growing the epitaxial layers, which is formed by performing the SEG method, are increased and eventually resistance of the source/drain of the FinFET is reduced. Simultaneously, since more epitaxial layers are formed on the patterned semiconductor layer, surface area of the source/drain are increased and thus process window of the contact process is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing multi-gate transistor device, comprising:
   providing a semiconductor substrate having a patterned semiconductor layer, a gate dielectric layer and a gate layer formed thereon, and the gate layer covering a portion of the patterned semiconductor layer, wherein the patterned semiconductor layer protrudes from a surface of the semiconductor substrate and comprises sidewalls perpendicular to the surface of the semiconductor substrate;
   forming a multiple insulating layer on the semiconductor substrate, the multiple insulating layer covering the patterned semiconductor layer and the gate layer, wherein the multiple insulating layer sequentially comprises a first insulating layer a second insulating layer and a third insulating layer sandwiched between the first insulating layer and the second insulating layer;
   performing a first etching process to remove a portion of the multiple insulating layer to simultaneously form a first spacer around the gate layer and a second spacer on the sidewalls of the patterned semiconductor layer;
   performing a second etching process to remove the second spacer and a portion of the first spacer to form a third spacer around the gate layer, and simultaneously to expose a portion of the third insulating layer, wherein the first insulating layer and the third insulating layer still covering the patterned semiconductor layer;
   performing a third etching process to remove the exposed third insulating layer to expose the first insulating layer, and the first insulating layer still covering the patterned semiconductor layer; and
   removing the exposed first insulating layer to expose the patterned semiconductor layer.

2. The method for manufacturing multi-gate transistor device according to claim 1, wherein the semiconductor substrate comprises a bulk silicon substrate or a silicon-on-insulator (SOI) substrate.

3. The method for manufacturing multi-gate transistor device according to claim 1, wherein the gate dielectric layer comprises a high-k dielectric material.

4. The method for manufacturing multi-gate transistor device according to claim 1, wherein the first spacer is larger than the second spacer.

5. The method for manufacturing multi-gate transistor device according to claim 1, wherein the first etching process comprises an anisotropic etching process.

6. The method for manufacturing multi-gate transistor device according to claim 1, wherein etching rates of the first insulating layer and the second insulating layer are different from an etching rate of the third insulating layer.

7. The method for manufacturing multi-gate transistor device according to claim 6, wherein the first insulating layer and the second insulating layer comprise silicon nitride and the third insulating layer comprises silicon oxide.

8. The method for manufacturing multi-gate transistor device according to claim 1, wherein the first insulating layer and the third insulating layer comprise a thickness smaller than 100 angstroms.

9. The method for manufacturing multi-gate transistor device according to claim 1, wherein the first etching process is performed to form the first spacer and the second spacer, and simultaneously expose a portion of the third insulating layer.

10. The method for manufacturing multi-gate transistor device according to claim 1, wherein the second etching process and the third etching process respectively comprise an isotropic etching process.

11. The method for manufacturing multi-gate transistor device according to claim 1, wherein the third spacer comprises the first insulating layer, the second insulating layer, and the third insulating layer.

12. The method for manufacturing multi-gate transistor device according to claim 1, further comprising forming an epitaxial source/drain in the patterned semiconductor layer after exposing the patterned semiconductor layer.

* * * * *